(12) United States Patent
Tang et al.

(10) Patent No.: US 12,205,750 B2
(45) Date of Patent: Jan. 21, 2025

(54) 3D MIS-FO HYBRID FOR EMBEDDED INDUCTOR PACKAGE STRUCTURE

(71) Applicant: Dialog Semiconductor (UK) Limited, London (GB)

(72) Inventors: Shih-Wen Tang, Taichung (TW); Jesus Mennen Belonio, Jr., Germering (DE); Che-Han Li, Taichung (TW)

(73) Assignee: Dialog Semiconductor (UK) Limited, London (GB)

(*) Notice: Subject to any disclaimer, the term of this patent is extended or adjusted under 35 U.S.C. 154(b) by 482 days.

(21) Appl. No.: 17/538,131

(22) Filed: Nov. 30, 2021

(65) Prior Publication Data

US 2023/0170131 A1  Jun. 1, 2023

(51) Int. Cl.
| | |
|---|---|
| H01L 23/31 | (2006.01) |
| H01F 27/02 | (2006.01) |
| H01F 27/28 | (2006.01) |
| H01F 41/04 | (2006.01) |
| H01L 49/02 | (2006.01) |

(52) U.S. Cl.
CPC ....... *H01F 27/2804* (2013.01); *H01F 27/022* (2013.01); *H01F 27/2823* (2013.01); *H01F 41/041* (2013.01); *H01L 23/3107* (2013.01); *H01L 28/10* (2013.01)

(58) Field of Classification Search
CPC . H01L 23/3107; H01L 28/10; H01F 27/2804; H01F 27/022; H01F 27/2823
See application file for complete search history.

(56) References Cited

U.S. PATENT DOCUMENTS

| | | | |
|---|---|---|---|
| 10,340,880 B2* | 7/2019 | Yen | H03H 7/42 |
| 10,763,164 B2 | 9/2020 | Chen et al. | |
| 11,011,466 B2* | 5/2021 | Bhagavat | H01L 23/5283 |
| 11,973,029 B2* | 4/2024 | Zhai | H01L 21/56 |
| 2014/0111273 A1* | 4/2014 | Jou | H01F 41/046 |
| | | | 327/564 |
| 2016/0233292 A1* | 8/2016 | Chen | H01L 28/10 |
| 2018/0337164 A1* | 11/2018 | Chen | H01L 23/5227 |
| 2019/0057809 A1* | 2/2019 | Kung | H01G 4/385 |
| 2019/0139911 A1* | 5/2019 | Gutierrez, III | H01L 24/19 |
| 2019/0385775 A1* | 12/2019 | Roth | H01L 24/97 |
| 2020/0035396 A1* | 1/2020 | Weis | H01F 27/24 |
| 2021/0166987 A1* | 6/2021 | Hu | H01L 23/5383 |
| 2022/0415555 A1* | 12/2022 | Dogiamis | H01L 25/0657 |

(Continued)

FOREIGN PATENT DOCUMENTS

CN  108369852 B  5/2021

OTHER PUBLICATIONS

German Office Action, File No. 10 2022 104 018.6, Applicant: Dialog Semiconductor (UK) Limited, Mail date: Jul. 26, 2022, 12 pages.

*Primary Examiner* — Nathan W Ha
(74) *Attorney, Agent, or Firm* — Salle Ackerman LLC; Stephen B. Ackerman; Rosemary L. S. Pike

(57) ABSTRACT

An inductor package is described comprising a mold interconnection substrate having an embedded spiral coil inductor, a fan-out redistribution layer connected to the spiral coil inductor by a copper post wiring structure, a ferrite toroid coil in between the copper posts, and a semiconductor die mounted on the mold interconnection substrate and connected to the fan-out redistribution layer.

19 Claims, 11 Drawing Sheets

(56) References Cited

U.S. PATENT DOCUMENTS

| | | | |
|---|---|---|---|
| 2023/0092492 A1* | 3/2023 | Ning | H01L 23/49827 |
| | | | 257/531 |
| 2023/0118422 A1* | 4/2023 | Kim | H01L 23/49838 |
| | | | 257/773 |
| 2024/0038701 A1* | 2/2024 | Kuo | H01L 25/105 |

* cited by examiner

3D MIS-FO HYBRID FOR EMBEDDED INDUCTOR PACKAGE STRUCTURE

(1) TECHNICAL FIELD

This disclosure is related to inductors, and more particularly, to an embedded inductor package having improved inductance performance.

(2) BACKGROUND

An inductor is a passive electrical component used extensively in voltage regulator modules of power management integrated circuits (IC) and also other applications such as analog circuits, signal processing systems, and wireless communication systems that can store energy in an electromagnetic field for introducing inductance to an electronic circuit. There are several major inductor technologies well known in the industrial market including (1) conversional Low Temperature Co-fired Ceramic (LTCC) inductor by a surface mount technology (SMT) process onto a substrate, (2) redistribution layer (RDL) inductor by a bumping process within a silicon or cap integrated passive device (IPD) package, and (3) organic inductor by substrate fabrication with patterned conductor layers and separated dielectric layers. Some limitations of the current inductor technologies in the industrial market may include challenges for large component size and thick component profile for LTCC Inductors by SMT on substrate, limited inductance performance due to thin Cu RDL and silicon eddy current with higher bumping cost for RDL Inductor within a die or IPD package, and bigger X/Y/Z substrate dimension for organic inductor by substrate fabrication process.

U.S. Pat. No. 10,763,164 (Chen et al) and U.S. Pat. No. 11,011,466 (Bhagavat et al) and U.S. Patent Application 2016/0233292 (Chen) disclose various inductor structures.

SUMMARY

It is the primary objective of the present disclosure to provide an embedded inductor package having improved inductance performance.

It is a further objective of the present disclosure to provide a mold interconnected substrate having an embedded spiral coil inductor and an integrated ferrite toroid coil for improved inductor performance.

It is a still further objective of the present disclosure to provide a mold interconnected substrate having an embedded spiral coil inductor and an integrated ferrite toroid coil with redistribution layers for interconnection of wiring structure as a magnetic core for improved inductor performance.

In accordance with the objectives of the present disclosure, an inductor package is provided comprising a mold interconnection substrate having an embedded spiral coil inductor, a fan-out redistribution layer connected to the spiral coil inductor by a copper post wiring structure, a ferrite toroid coil in between the copper posts, and a semiconductor die mounted on the mold interconnection substrate and connected to the fan-out redistribution layer.

Also in accordance with the objectives of the present disclosure, an inductor package is provided comprising a mold interconnection substrate having an embedded spiral coil inductor, a hybrid wiring structure surrounding a magnetic core on the mold interconnection substrate, and a semiconductor die mounted on the mold interconnection substrate.

Also in accordance with the objectives of the present disclosure, a method for fabricating an inductor package is provided comprising the following steps. A copper spiral inductor is embedded within a mold interconnect substrate. A wiring structure of copper plates and copper posts is formed on the mold interconnect substrate, electrically connected to the copper spiral inductor. A semiconductor die is mounted on the mold interconnect substrate. A ferrite toroid coil is mounted on the mold interconnect substrate between the copper posts. The ferrite toroid coil and the semiconductor die are covered with a molding compound wherein tops of the copper posts and copper pillars on an upper side of the semiconductor die are exposed. Redistribution layer structures are formed on the molding compound and interconnecting with the copper posts and the copper pillars on an underside of the redistribution layers and providing connections outside of the package on an upper side of the redistribution layer structures.

BRIEF DESCRIPTION OF THE DRAWINGS

In the accompanying drawings forming a material part of this description, there is shown.

DETAILED DESCRIPTION

The present disclosure provides an inductor package with improved inductance performance. The essential features of the present disclosure are a spiral coil inductor embedded in a mold interconnect substrate (MIS), a hybrid wiring structure for a ferrite toroid coil on the MIS, and fan-out redistribution layer interconnection with copper posts of the MIS to achieve a 3D MIS-FO-hybrid wiring structure for magnetic core.

The hybrid wiring interconnection making up the magnetic core of the inductor package is formed by substrate conductor traces and conductive pillars on one side of the ferrite toroid coil and redistribution layer (RDL) structures on the other side of the ferrite toroid coil to connect those conductive pillars in a molding layer for generating a magnetic field loop around the ferrite toroid coil. The metal wiring structure as a magnetic core further enlarges the inductor performance of the embedded spiral coil inductor to achieve the desired inductance in this package structure.

Figure 1:
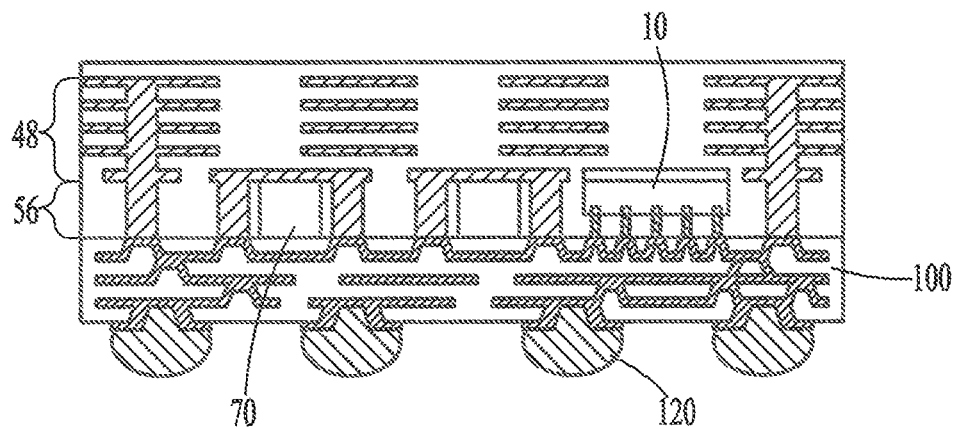
FIG. 1 is a cross sectional representation of a completed embedded inductor of the present disclosure.

FIG. 1 illustrates the inductor package of the present disclosure. Illustrated is a 3D mold interconnect substrate (MIS) fan-out (FO) hybrid wiring structure 56 for a ferrite toroid coil magnetic core. Also shown are a spiral coil inductor 48 embedded in the MIS, FO redistribution layer (RDL) 100, and copper post interconnection 54 between the MIS and the RDL.

Figure 2A:
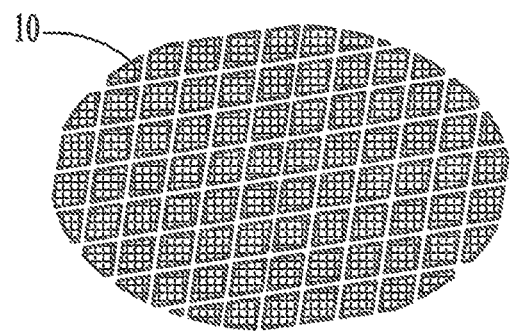
FIGS. 2A-2D are cross-sectional representations of die preparation steps in the process of the present disclosure.
Figure 2B:
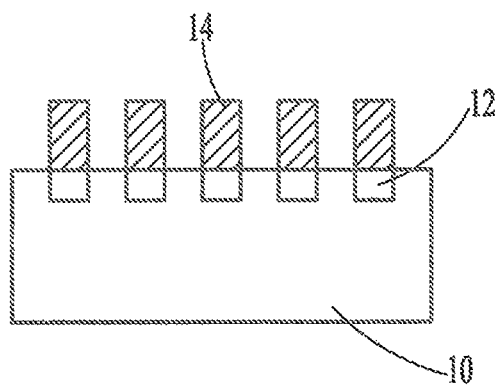
Figure 2C:
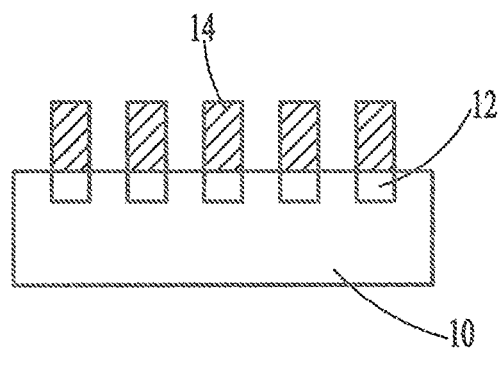
Figure 2D:
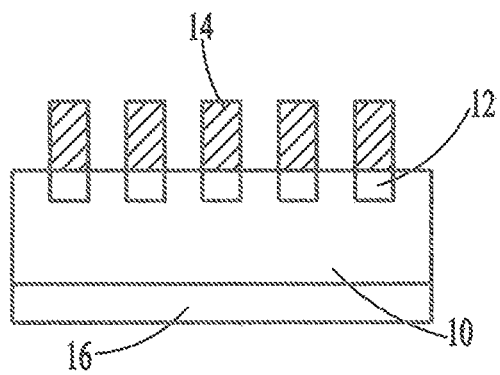

Referring to the remaining drawing figures, an exemplary process for manufacturing the inductor package of the present disclosure will be described in detail. Referring now more particularly to FIGS. 2A-2D, the die preparation process will be described. FIG. 2A illustrates an incoming wafer 10. A pattern of conductive pads 12 is formed on the wafer surface, separated by a dielectric layer. Copper (Cu) pillars 14 are plated on the conductive pads 12 for future interconnection, as shown in FIG. 2B. In FIG. 2C, the wafer is lapped to the required die thickness. Die attach film 16 is added for pad face up die bonding process adhesion, as shown in FIG. 2D, and then the wafer is sawed into individual dies.

Figure 3A:
FIGS. 3A-3N are cross-sectional representations of inductor substrate preparation steps in the process of the present disclosure.
Figure 3B:
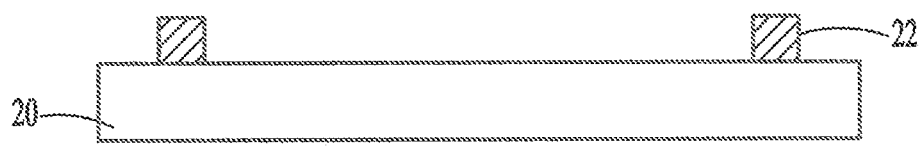
Figure 3C:
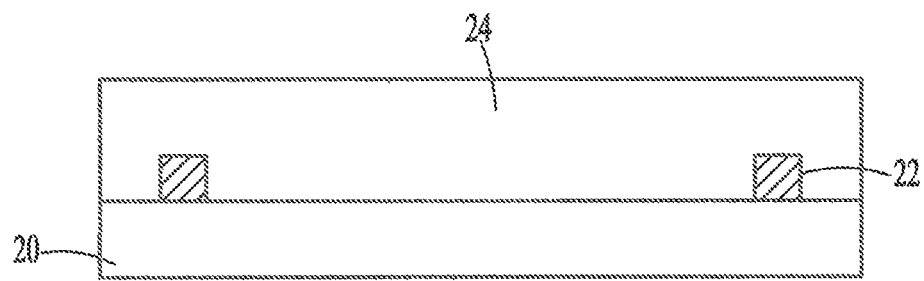
Figure 3D:
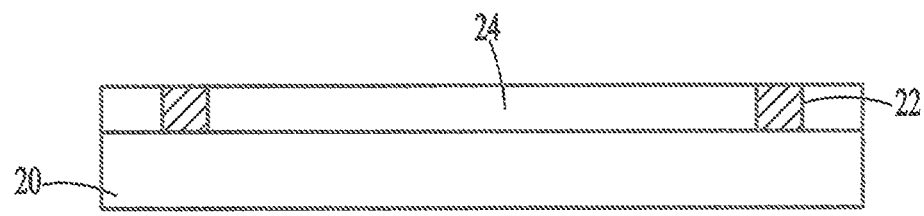
Figure 3E:
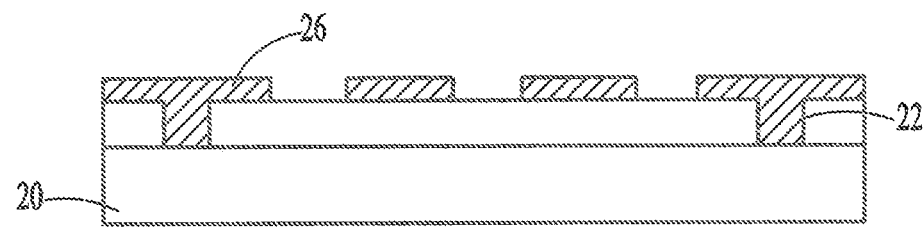

A Mold Interconnect Substrate (MIS) is fabricated with a spiral coil Inductor embedded by thicker patterned conductor layers and separated compound layers for Cu Post plating on top for interconnection of the wiring structure. This process includes applying temporary carrier bond/de-bond technology with a release layer for Cu pillar plating by panel level handling. Referring now to FIGS. 3A-3N and 4A-4C, an exemplary inductor substrate preparation process is described. FIG. 3A illustrates a carrier 20. Copper pillar plating is performed on the carrier 20 to form copper pillars 22, illustrated in FIG. 3B. Next, in FIG. 3C, the copper pillars are covered with an epoxy molding compound (EMC) 24. The EMC 24 is lapped to expose the tops of the copper pillars, as seen in FIG. 3D. A first level of spiral coil copper 26 plating is performed, shown in cross-section in FIG. 3E and in a top view in FIG. 4A. Copper plating could be about 20 to 60 μm thick for each layer. Using bumping RDL technology would result in a thin copper layer of about 20 μm for one layer. The thick Cu plating and multi-layer routing of the present disclosure can offer better inductance performance.

Figure 3F:
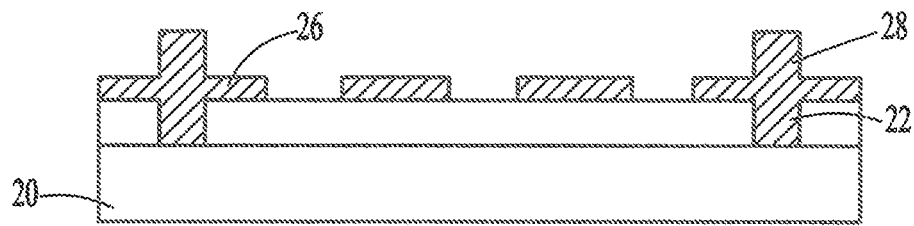
Figure 3G:
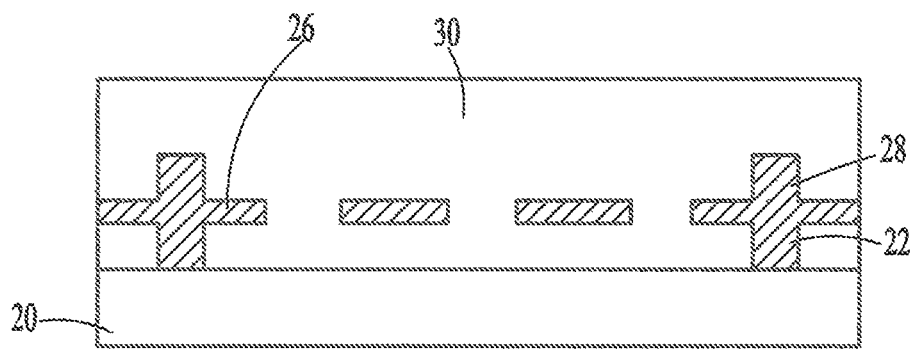
Figure 3H:
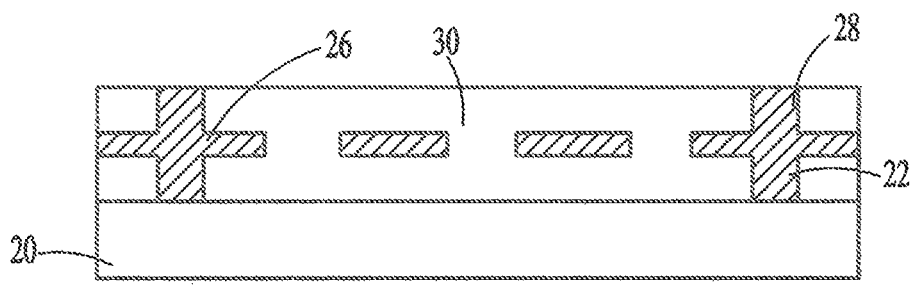
Figure 3I:
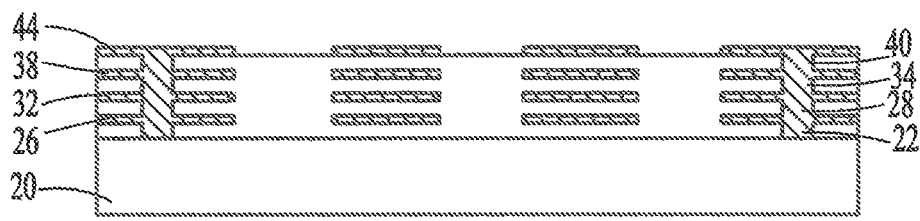
Figure 3J:
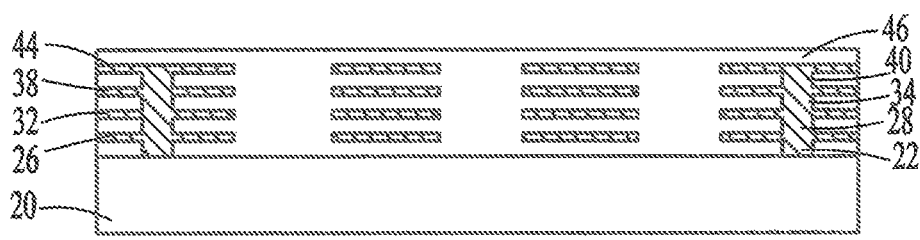
Figure 3K:
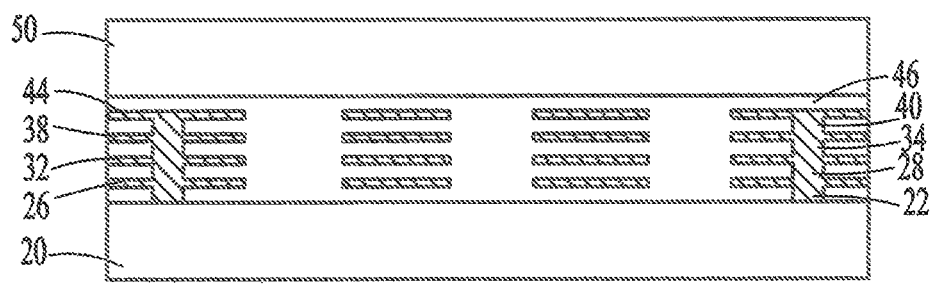

A second layer of copper pillars 28 is plated on top of the first spiral plating 26, as shown in FIG. 3F. A second EMC molding layer 30 is coated over the copper pillars 28 (FIG. 3G) and lapped (FIG. 3H) to expose the tops of the copper pillars 28. A second level of spiral coil copper 32 plating is performed, shown in FIG. 3I. These steps are repeated to form additional levels of copper pillars 34, 40 and spiral plating 38, 42. Finally, as shown in FIG. 3J, a top most molding 46 is performed and a second carrier 50 is bonded to the top of the substrate, as shown in FIG. 3K.

Figure 3L:
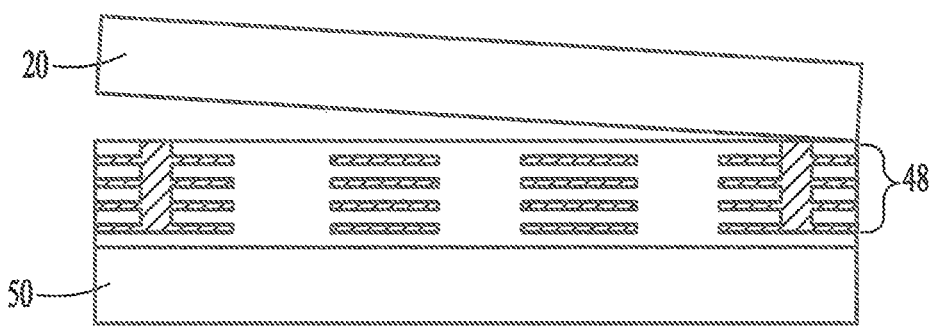
Figure 4A:
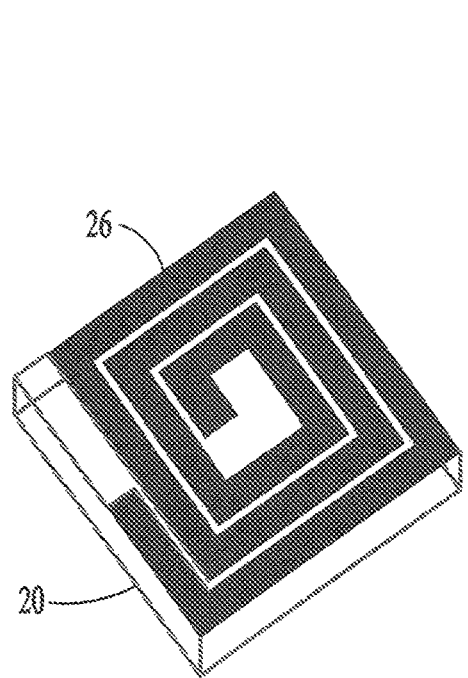
FIGS. 4A-4C are oblique views of inductor substrate structures in the process of the present disclosure.
Figure 4B:
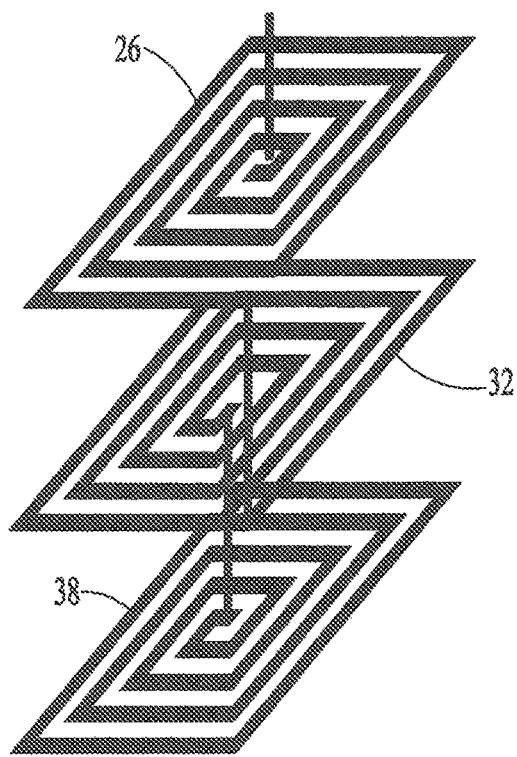

FIG. 3L shows the substrate flipped so that the first carrier 20 is at the top of the figure and the second carrier 50 is at the bottom of the figure with the substrate 48 in between. The first carrier 20 is now de-bonded from the substrate to expose the copper pad of the initial copper pillar plating 22. FIG. 4B illustrates an example of the spiral coil routing structure that has been formed in the substrate 48. This example shows three coil layers while FIG. 3L illustrates four coil layers. The spiral inductor could have from one to about six coil layers embedded in the substrate structure.

Figure 3M:
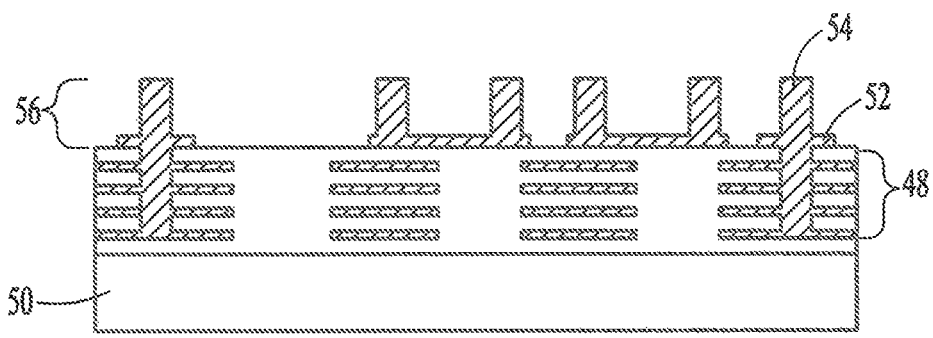
Figure 3N:
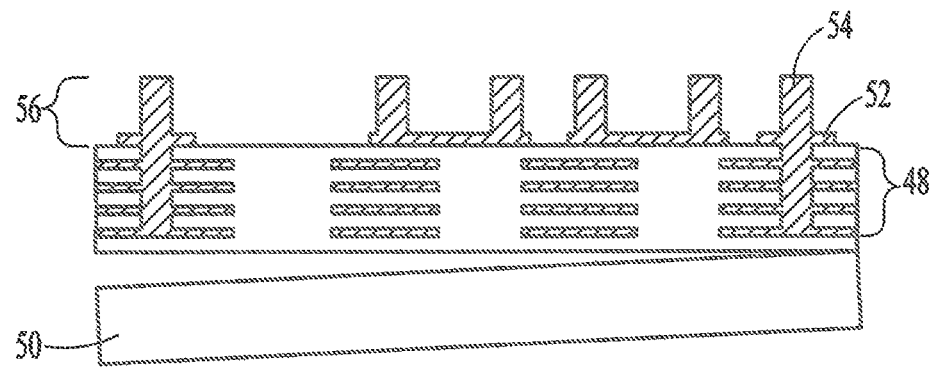
Figure 4C:
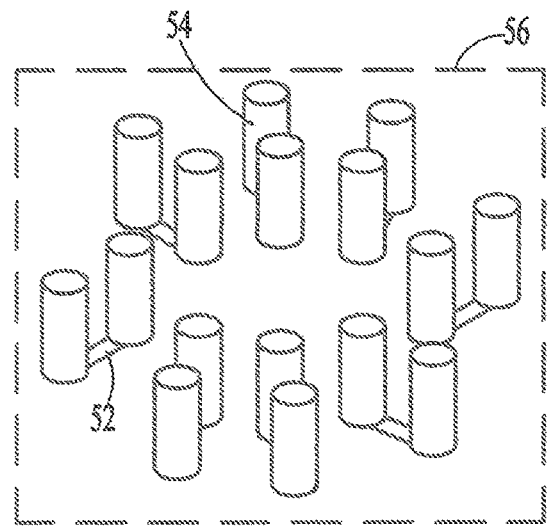

Now, a wiring structure will be formed over the spiral coil. Referring now to FIG. 3M, copper plates 52 are formed on the substrate 48. Copper posts 54 are plated onto the copper plates 52. FIG. 4C shows a top view of the wiring structure 56 comprising copper plates 52 and copper posts 54. The wiring structure reserves space for ferrite toroid coil placement in the subsequent package assembly process. As shown in FIG. 3N, the second carrier 50 is released from the MIS substrate 48 and the substrate is singulated in strip or unit form. The completed MIS substrate contains only the two materials—copper and molding compound.

In the package assembly process, a die is bonded to the substrate and a ferrite toroid coil is placed in between the MIS Cu Posts and attached by an adhesive epoxy. A ferrite core is a type of magnetic core made of ferrite (iron oxides) combined with, for example, cobalt (Co), nickel (Ni), zirconium (Zr), tantalum (Ta), niobium (Nb), rhenium (Re), neodymium (Nd), praseodymium (Pr) and/or manganese compounds or the like. Next, a fan-out (FO) process creates connections for board level interconnection.

Figure 5A:
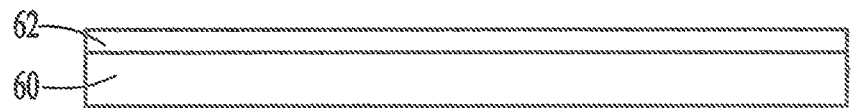
FIGS. 5A-5I are cross-sectional representations of package assembly steps in the process of the present disclosure.
Figure 5B:
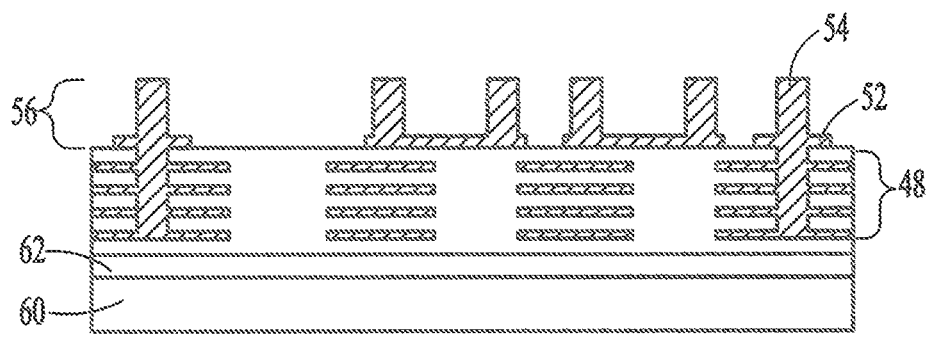
Figure 5C:
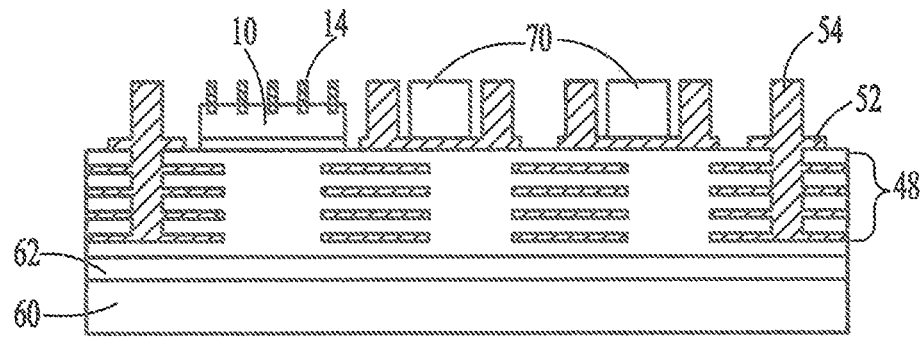

The package assembly process will be described with reference to FIGS. 5A-5I and 6A-6C. A wafer form carrier 60 is shown in FIG. 5A with a release layer 62. In FIG. 5B, multiple inductor substrates 48/56 are mounted on the carrier 60. A die 10 is mounted onto the substrate 48 by die bonding with die pads and pillars 14 face up, as shown in FIG. 5C. A ferrite toroid coil 70 is placed in the reserved space in the wiring structure 56 and mounted using adhesive epoxy.

Figure 6A:
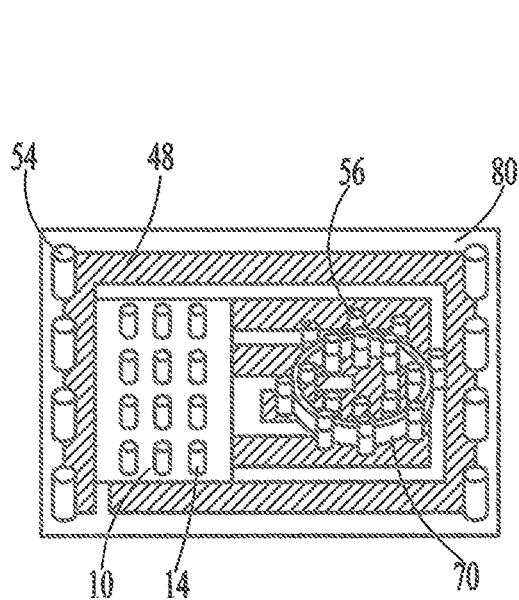
FIGS. 6A and 6C are oblique views of inductor structures in the process of the present disclosure.
Figure 6B:
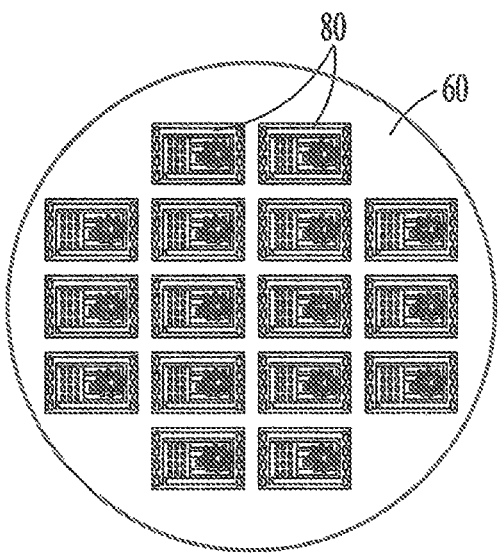
FIG. 6B is a top view of a wafer in the process of the present disclosure.

FIG. 6A illustrates a top view of a single package 80 showing the die 10 with copper pillars 14, the wiring structure 56, the ferrite toroid coil 70, and the spiral coil 48 and copper pillars 54 under the wiring structure 56. FIG. 6B illustrates the carrier wafer 60 with multiple packages 80 mounted thereon.

Figure 5D:
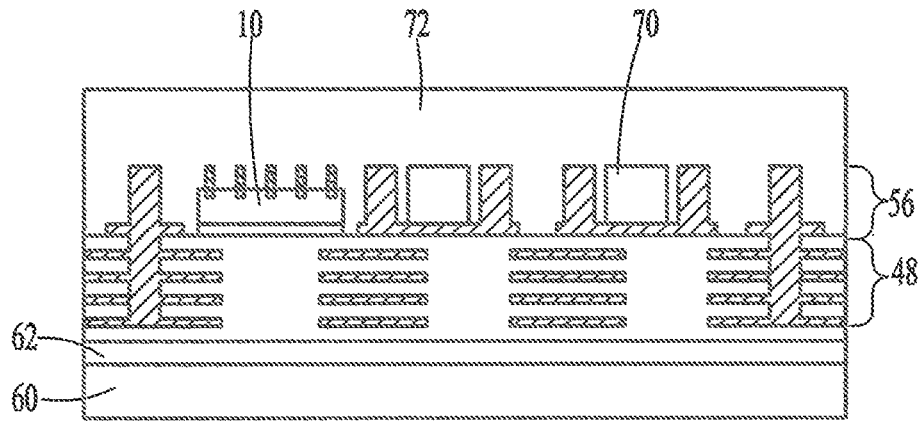
Figure 5E:
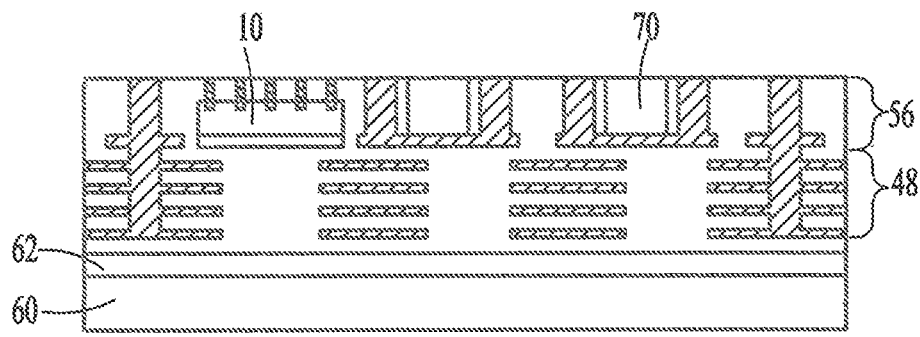

Referring now to FIG. 5D, EMC 72 is coated over the die, copper posts, and ferrite toroid coil. The EMC is lapped (FIG. 5E) to expose the tops of the copper posts 54 and die pillars 14. The ferrite toroid coil 70 remains covered by the EMC.

Figure 5F:
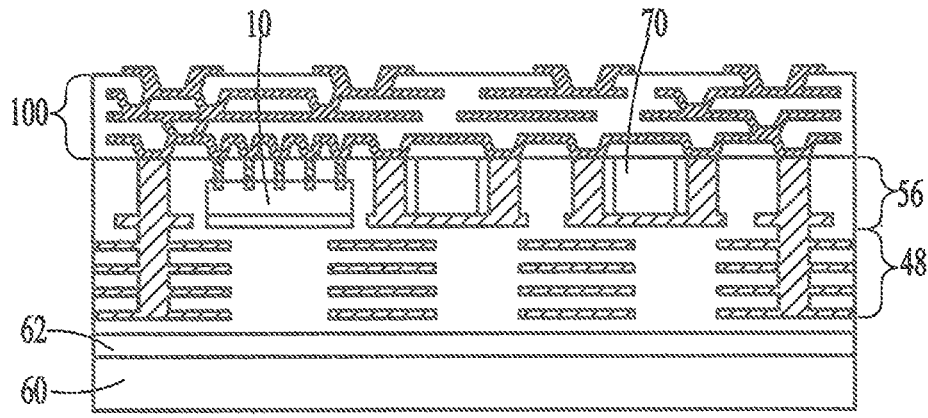
Figure 6C:
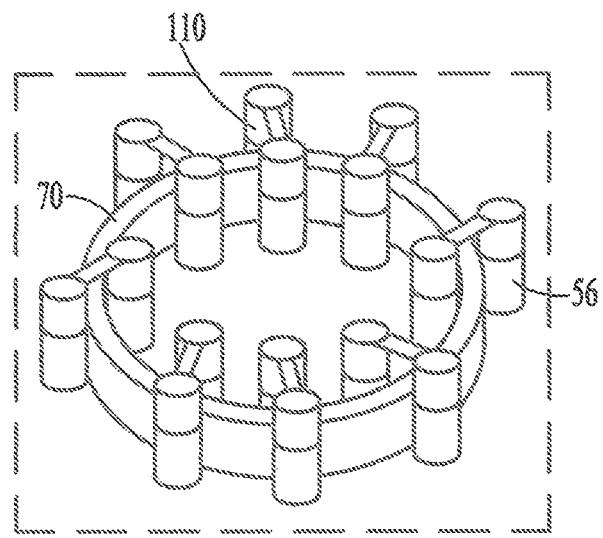

Now, as shown in FIG. 5F, bumping redistribution layer (RDL) architecture is formed on the molding compound 72 to interconnect the die I/O and top/bottom wiring structure of the ferrite toroid coil in a 3D MIS-FO hybrid package form. For example, a three-layer RDL structure 100 is formed on the EMC 72. FIG. 6C shows the wiring structure 56 with ferrite toroid coil 70 and RDL 110 on each copper post 54 of the wiring structure.

Figure 5G:
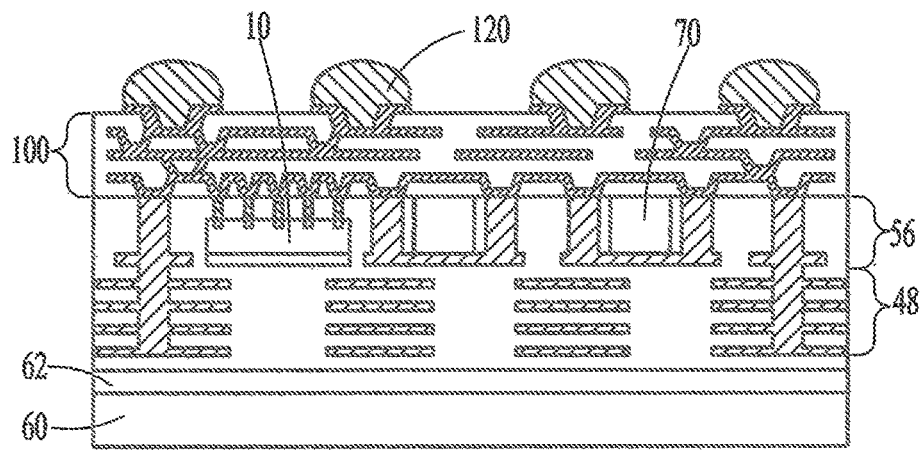
Figure 5H:
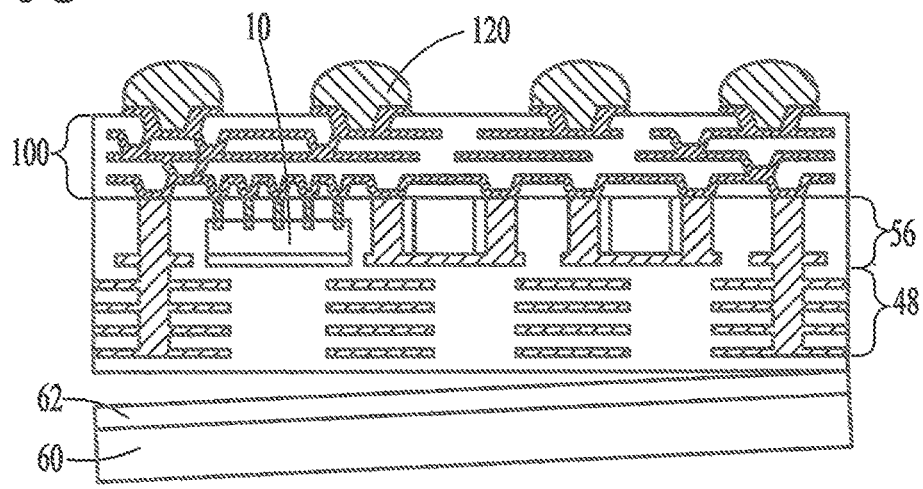
Figure 5I:
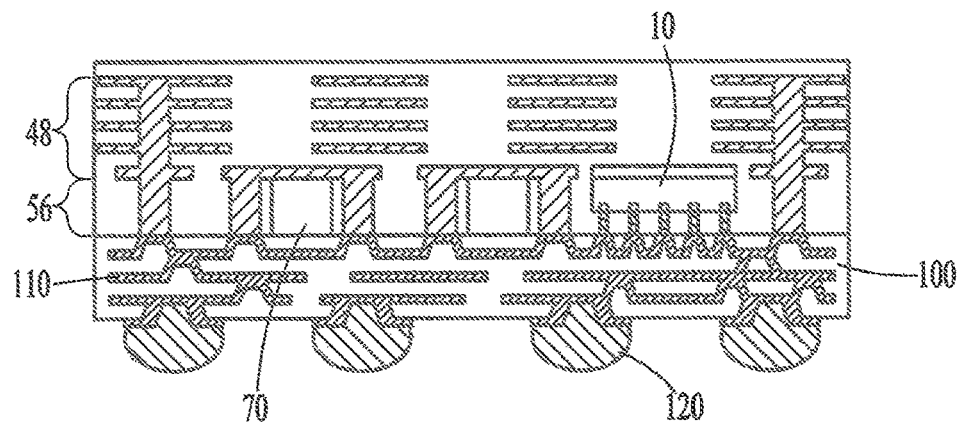

In the final process stage of package assembly, for example, under bump metallization (UBM) and solder ball 120 placement is shown in FIG. 5G to create the connection for board level interconnection. In FIG. 5H, carrier 60 is de-bonded from the packages and, in FIG. 5I, the package units are singulated.

The package of the present disclosure provides a Mold Interconnected Substrate (MIS) with an embedded thick Cu plating of Spiral Coil Inductor. This inductor is able to provide a larger inductance as compared to thin Cu RDL inductors.

Additionally, the integrated Ferrite Toroid Coil in the package of the present disclosure with hybrid wiring structure by Fan-Out Redistribution Layer (FO-RDL) connection as the magnetic core further reinforces the inductance capability. The thin film fan-out RDL for Chip to Board interconnection has a short pathway for providing a more competitive advantage product. Generally, the total thickness of three layers of thin film fan-out RDL may be in the range of about 50 to about 70 μm, but a conventional substrate thickness for three layers must be larger than 85 μm in total. To route high-speed circuitry successfully, the guideline is to keep signal path traces short and direct.

MIS-FO hybrid construction is able to achieve the additional advantages of a cost-effective solution as well as decreased process cycle time of Outsourced Assembly and Test (OSAT) assembly from the entirely bumping RDL process.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. An inductor package comprising:
   a mold interconnection substrate having an embedded spiral coil inductor each layer of said spiral coil inductor having a thickness in the range of between 20 µm and 60 µm;
   a fan-out redistribution layer connected to said spiral coil inductor by a copper post wiring structure;
   a ferrite toroid coil in between said copper posts configured to increase inductance of said embedded spiral coil inductor; and
   a semiconductor die mounted on said mold interconnection substrate and connected to said fan-out redistribution layer.

2. The package according to claim 1 wherein said spiral coil inductor comprises copper.

3. The package according to claim 1 wherein said spiral coil inductor has at least one layer and up to about six layers of copper.

4. The package according to claim 1 wherein said fan-out redistribution layer comprises at least two metal redistribution layers separated by a dielectric layer.

5. The package according to claim 1 wherein said fan-out redistribution layer has a thickness in the range from about 5 µm to about 20 µm per one layer of copper plating.

6. The package according to claim 1 wherein copper pillars connect circuits within said semiconductor die to said fan-out redistribution layer.

7. The package according to claim 1 wherein said ferrite toroid coil comprises ferrite combined with cobalt, nickel, zirconium, tantalum, niobium, rhenium, neodymium, praseodymium and/or manganese compounds.

8. The package according to claim 1 further comprising an epoxy molding compound surrounding said ferrite toroid coil and copper posts between said mold interconnect substrate and said fan-out redistribution layer.

9. The package according to claim 1 further comprising solder balls connected to said fan-out redistribution layer on a side opposite to said copper post wiring structure.

10. An inductor package comprising:
    a mold interconnection substrate having an embedded spiral coil inductor each layer of said spiral coil inductor having a thickness in the range of between 20 µm and 60 µm;
    a hybrid wiring structure surrounding a magnetic core on said mold interconnection substrate wherein said hybrid wiring structure surrounding said magnetic core comprises:
       conductor traces and conductive pillars on said mold interconnection substrate and electrically connected to said embedded spiral coil inductor;
       a ferrite toroid coil in between said conductive pillars on said mold interconnection substrate; and
       redistribution layer structures on an opposite side of said ferrite toroid coil from said mold interconnection substrate and connecting to said conductive pillars in a molding layer; and
    a semiconductor die mounted on said mold interconnection substrate on a same side od said mold interconnection substrate as said ferrite toroid coil.

11. The package according to claim 10 wherein said spiral coil inductor comprises copper.

12. The package according to claim 10 wherein said spiral coil inductor has at least one layer and up to about six layers of copper.

13. The package according to claim 10 wherein said ferrite toroid coil comprises ferrite combined with cobalt, nickel, zirconium, tantalum, niobium, rhenium, neodymium, praseodymium and/or manganese compounds.

14. The package according to claim 10 further comprising an epoxy molding compound surrounding said ferrite toroid coil and conductive pillars between said mold interconnect substrate and said fan-out redistribution layer.

15. The package according to claim 10 wherein said conductive traces and said conductive pillars comprise copper.

16. The package according to claim 10 wherein said redistribution layer structures comprise at least two metal redistribution layers separated by a dielectric layer.

17. The package according to claim 10 wherein conductive pillars connect circuits within said semiconductor die to said redistribution layer structures.

18. The package according to claim 10 further comprising solder balls connected to said redistribution layer structures on a side opposite to said conductive pillars.

19. A method for fabricating an inductor package comprising:
    embedding a copper spiral inductor within a mold interconnect substrate;
    forming a wiring structure of copper plates and copper posts on said mold interconnect substrate, electrically connected to said copper spiral inductor;
    mounting a semiconductor die on said mold interconnect substrate;
    mounting a ferrite toroid coil on said mold interconnect substrate between said copper posts;
    covering said ferrite toroid coil and said semiconductor die with a molding compound wherein tops of said copper posts and copper pillars on an upper side of said semiconductor die are exposed; and
    forming redistribution layer structures on said molding compound interconnecting with said copper posts and said copper pillars on an underside of said redistribution layers and providing connections outside of said package on an upper side of said redistribution layer structures.

* * * * *